(12) United States Patent
Lee

(10) Patent No.: US 8,618,677 B2
(45) Date of Patent: Dec. 31, 2013

(54) WIREBONDED SEMICONDUCTOR PACKAGE

(75) Inventor: Ta-Chun Lee, Taipei (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 13/441,796

(22) Filed: Apr. 6, 2012

(65) Prior Publication Data

US 2013/0264712 A1   Oct. 10, 2013

(51) Int. Cl.
| H01L 23/48 | (2006.01) |
| H01L 23/52 | (2006.01) |
| H01L 29/40 | (2006.01) |
| H01L 21/44 | (2006.01) |
| H01L 21/4763 | (2006.01) |

(52) U.S. Cl.
USPC ...... 257/784; 257/762; 257/769; 257/E23.02; 257/E23.025; 438/617; 438/650; 438/686; 438/687

(58) Field of Classification Search
None
See application file for complete search history.

(56) References Cited

U.S. PATENT DOCUMENTS

| | | |
|---|---|---|
| 3,443,914 A | 5/1969 | Hayashi |
| 3,662,454 A | 5/1972 | Miller |
| 4,395,320 A | 7/1983 | Kasashima et al. |
| 4,415,115 A | 11/1983 | James |
| 4,886,200 A | 12/1989 | Tsumura |
| 5,060,051 A | 10/1991 | Usuda |
| 5,293,073 A | 3/1994 | Ono |
| 5,298,793 A | 3/1994 | Kotani et al. |
| 5,337,941 A | 8/1994 | Higashiura et al. |
| 5,455,195 A | 10/1995 | Ramsey et al. |
| 6,046,504 A | 4/2000 | Kimura |
| 6,062,462 A | 5/2000 | Gillotti et al. |
| 6,100,598 A | 8/2000 | Kanesaka |
| 6,158,647 A | 12/2000 | Chapman et al. |
| 6,164,523 A | 12/2000 | Fauty et al. |
| 6,234,376 B1 | 5/2001 | Wicen |
| 6,329,722 B1 | 12/2001 | Shih et al. |
| 6,581,816 B2 | 6/2003 | Vitali et al. |
| 6,582,979 B2* | 6/2003 | Coccioli et al. ............... 438/25 |
| 6,664,136 B2 | 12/2003 | Motonami et al. |
| 6,696,756 B2* | 2/2004 | Chang ........................ 257/734 |
| 6,780,467 B2 | 8/2004 | Imori et al. |
| 6,800,555 B2 | 10/2004 | Test et al. |
| 6,815,789 B2 | 11/2004 | Tiziani et al. |
| 6,853,056 B2 | 2/2005 | Fukatani et al. |

(Continued)

OTHER PUBLICATIONS

Appelt et al., Fine Pitch Copper Wire Bonding Introduction to High Volume Production, Electronics System Integration Technology Conferences (ESTC), Sep. 13-16, 2010, Berlin, Germany.

*Primary Examiner* — Hoang-Quan Ho
(74) *Attorney, Agent, or Firm* — Morgan Law Offices, PLC

(57) ABSTRACT

A semiconductor package including a substrate, a semiconductor device, a protection layer, a bonding wire, and a molding compound is provided. The substrate has a contact pad and a solder mask, and the contact pad is exposed from the solder mask. The semiconductor device is disposed on the substrate. The protection layer is disposed on the contact pad. The bonding wire connects the semiconductor device to the contact pad. An end of the bonding wire penetrates the protection layer and bonds with a portion of a surface of the contact pad to form a bonding region. The protection layer covers an entire surface of the contact pad except the bonding region. The molding compound covers the semiconductor device, the contact pad, and the bonding wire.

12 Claims, 2 Drawing Sheets

(56) References Cited

U.S. PATENT DOCUMENTS

| | | | |
|---|---|---|---|
| 6,867,493 B2* | 3/2005 | Hashemi et al. | 257/717 |
| 6,974,776 B2 | 12/2005 | Dean et al. | |
| 7,294,217 B2 | 11/2007 | Beatson et al. | |
| 7,411,157 B2 | 8/2008 | Brunner et al. | |
| 7,413,974 B2 | 8/2008 | Test et al. | |
| 7,427,009 B2 | 9/2008 | Lim et al. | |
| 7,459,387 B2* | 12/2008 | Tiziani et al. | 438/614 |
| 7,523,848 B2 | 4/2009 | Beatson et al. | |
| 7,535,104 B2 | 5/2009 | Test et al. | |
| 7,550,844 B2 | 6/2009 | Matsuki et al. | |
| 7,820,913 B2* | 10/2010 | Uno et al. | 174/94 R |
| 7,956,469 B2* | 6/2011 | Hayashi et al. | 257/767 |
| 8,063,315 B2* | 11/2011 | Das et al. | 174/262 |
| 8,102,061 B2* | 1/2012 | Uno et al. | 257/784 |
| 2003/0013288 A1* | 1/2003 | Chang | 438/597 |
| 2004/0212088 A1* | 10/2004 | Chen et al. | 257/738 |
| 2004/0245320 A1* | 12/2004 | Fukagaya et al. | 228/110.1 |
| 2005/0067382 A1 | 3/2005 | Gillotti et al. | |
| 2005/0151253 A1* | 7/2005 | Nonaka et al. | 257/741 |
| 2005/0199677 A1 | 9/2005 | Sadler et al. | |
| 2005/0242446 A1 | 11/2005 | Jin | |
| 2006/0012042 A1* | 1/2006 | Taggert et al. | 257/738 |
| 2006/0055023 A1* | 3/2006 | Ho et al. | 257/692 |
| 2008/0083815 A1 | 4/2008 | Nachon et al. | |
| 2008/0203568 A1 | 8/2008 | Tanaka et al. | |
| 2008/0233733 A1 | 9/2008 | Lin | |
| 2008/0265385 A1 | 10/2008 | Tsai et al. | |
| 2008/0314963 A1 | 12/2008 | Itzhaky et al. | |
| 2009/0145649 A1* | 6/2009 | Horiuchi et al. | 174/260 |
| 2009/0179326 A1* | 7/2009 | Tso et al. | 257/737 |
| 2010/0007004 A1 | 1/2010 | Chang et al. | |
| 2010/0007009 A1 | 1/2010 | Chang et al. | |
| 2010/0007010 A1 | 1/2010 | Chang et al. | |
| 2010/0007011 A1 | 1/2010 | Hung et al. | |
| 2010/0080957 A1* | 4/2010 | Chinn et al. | 428/147 |
| 2010/0200969 A1 | 8/2010 | Huang et al. | |
| 2010/0200974 A1* | 8/2010 | Weng et al. | 257/686 |
| 2010/0200981 A1 | 8/2010 | Huang et al. | |
| 2011/0049219 A1 | 3/2011 | Huang et al. | |
| 2012/0223432 A1* | 9/2012 | Delucca et al. | 257/771 |
| 2012/0273954 A1* | 11/2012 | Higgins, III | 257/762 |

* cited by examiner

US 8,618,677 B2

WIREBONDED SEMICONDUCTOR PACKAGE

BACKGROUND OF THE INVENTION

1. Field of the Invention

The present invention relates to the field of semiconductor packaging, and, more particularly, to wire bonding of semiconductor packages.

2. Description of Related Art

Wire bonding involves electrical connection of a semiconductor chip and a substrate, such as a printed circuit board (PCB) or a lead frame. Conventionally, an organic solderability preservative (OSP) material is placed on a contact pad so as to prevent surface oxidation of the contact pad. In the typical process, an organic material is formed on the bare contact pad to protect the contact pad from being oxidized. The organic material is removed from the contact pad when access to the contact pad is desired. However, after removing the organic material, the surface of the pad is exposed and may be immediately oxidized as it reacts with outside elements, such as moisture. This may result in poor solderability in subsequent soldering or bonding processing. Alternatively, a conductive nickel-gold layer can be used but the material cost is relatively high because gold is expensive.

SUMMARY OF THE INVENTION

One aspect of the disclosure relates to a semiconductor package. The semiconductor package comprises a semiconductor device; a substrate, including a contact pad having a protection layer disposed thereon; a bonding wire, connecting the semiconductor device to the contact pad, wherein a distal end of the bonding wire penetrates the protection layer and bonds with a portion of a surface of the contact pad to form a bonding region; and a molding compound, covering the semiconductor device, the contact pad, and the bonding wire. The contact pad is exposed from a solder mask and covered substantially entirely by the protection layer except at the bonding region. In an embodiment, the bonding wire and the contact pad are copper, and a bonding between the end of the bonding wire penetrating the protection layer and the contact pad is a copper-copper bonding. In other embodiments, the bonding wire is a palladium coated copper wire, and a copper-palladium-copper intermetallic region is located in the bonding region. In still other embodiments, the bonding wire can be a gold wire. The protection layer may include a conductive organic metal material, such as a combination of an electrically conductive polymer and a plurality of noble metal particles (e.g., nano-sized silver particles). The organic material imparts a visible coating for ease of inspection that ensures a visually inspectable surface finish. Alternatively, the protection layer can include a ceramic nano-coating.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
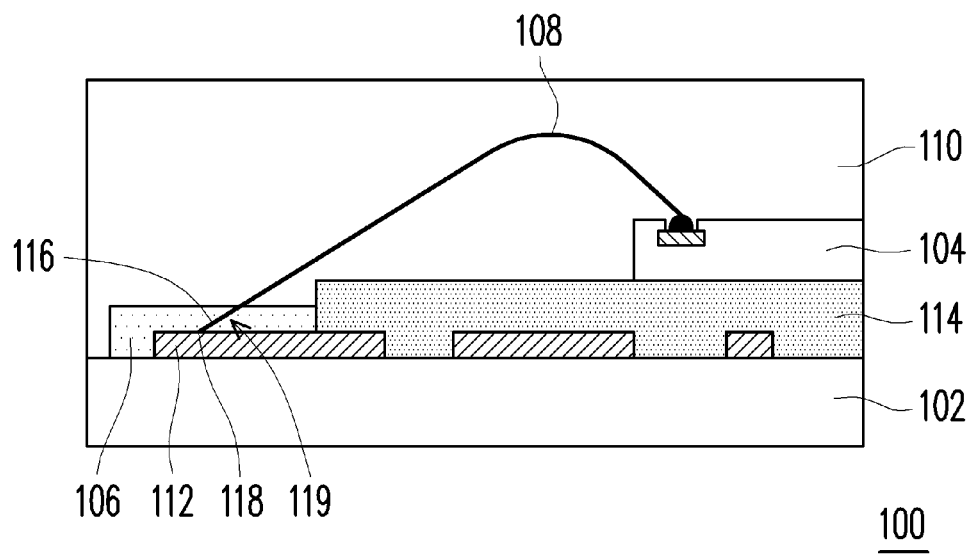
FIG. 1 is a cross sectional view of film layers of a portion of a semiconductor package according to one embodiment of the present invention.

Referring to FIG. 1, a semiconductor package 100 according to an embodiment of the present invention is shown. The semiconductor package 100 includes a substrate 102, a semiconductor device 104, a protection layer 106, a bonding wire 108, and a molding compound 110.

The upper surface of the substrate 102 is provided with a contact pad 112 and a solder mask 114, wherein the contact pad is exposed from the solder mask 114. The contact pad 112 is primarily made of copper. The contact pad 112 is connected to another bonding pad (not shown) provided on the lower surface of the substrate 102 through an inner conductive circuit (not shown) of the substrate 102. The bonding pad on the lower surface of the substrate 102 may be provided with a solder ball (not shown) for further connecting to an external printed circuit board (not shown).

The semiconductor device 104 is disposed on the substrate 102. The protection layer 106 is formed on the contact pad 112. In one embodiment, the protection layer 106 includes an electrically conductive organic metal material. The organic metal material can include a combination of an electrically conductive polymer and noble metal particles (e.g., nano-sized silver particles) which is capable of modifying or passivating the surface of the contact pad 112 to increase the surface oxidation potential of the contact pad 112, thereby reducing and/or preventing surface oxidation. Additionally, the organic metal material imparts a visible coating for ease of inspection that ensures a visually inspectable surface finish is ready for assembly. Furthermore, the organic metal material delivers a highly conductive surface finish that enables bare-board in-circuit testing directly after its application. Accordingly, the need to paste test points during board assembly is eliminated.

Alternatively, the protection layer 106 may include an electrically non-conductive material, e.g., a ceramic nano-coating which repels water, but retains the ability to be penetrated by electrical connectors or wire bonding.

The bonding wire 108 electrically connects the semiconductor device 104 to the contact pad 112. The bonding wire 108 may be a copper wire primarily made of copper (for example, a bare copper wire), a palladium-coated copper wire, or a gold wire primarily made of gold.

The bonding wire 108 has a first end portion bonded to a bonding pad 104a of the semiconductor device 104, and a second end portion 116 penetrating the protection layer 106 and bonded to a portion of the surface of the contact pad 112, thereby forming a bonding region 118. In one embodiment, if the bonding wire 108 is the bare copper wire, a copper-copper bonding interface is formed between the surface of the contact pad 112 and the bonding wire 108. The copper-copper bonding interface is formed by atomic diffusion between the copper contact pad and the copper bonding wire. In another embodiment, if the bonding wire 108 is the gold wire, a plurality of layers of copper and gold alloys is formed between the surface of the contact pad 112 and the bonding wire 108.

Figure 2:
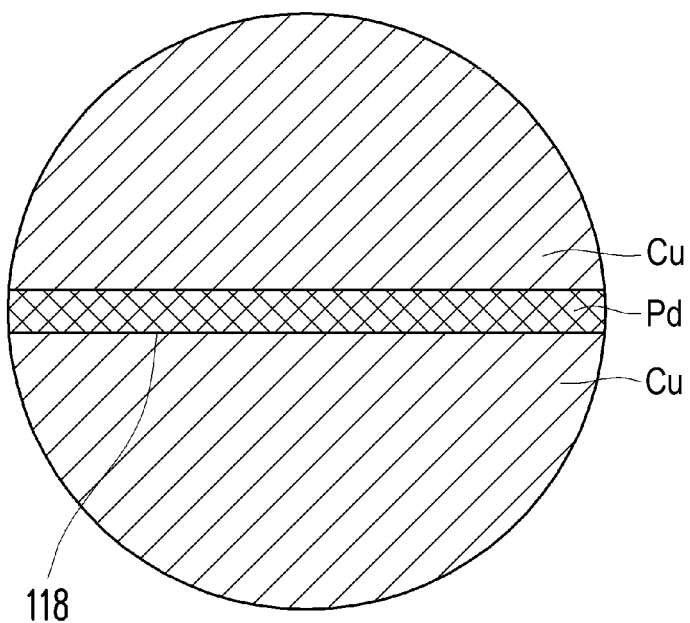
FIG. 2 is a partially enlarged view of a bonding region of a palladium coated copper wire and a bonding pad.

In still another embodiment, if the bonding wire 108 is the palladium-coated copper wire, a copper-palladium-copper intermetallic region is formed between the surface of the contact pad 112 and the bonding wire 108. Referring to FIG. 2, a continuous palladium layer 108a is formed between the surface of the contact pad 112 and the bonding wire 108.

Figure 3:
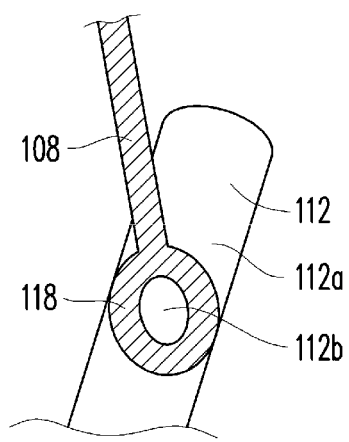
FIG. 3 is a fragmentary enlarged perspective view showing the bonding of the coupling element to the contact pad shown in FIG. 1.

Note that the protection layer 106 covers the entire surface of the contact pad 112 except the bonding region 118, i.e., the copper-copper bonding interface, the copper-palladium-copper intermetallic region, or the copper and gold alloy layers. Referring to FIG. 3, the protection layer 106 covers a first region 112a surrounding the bonding region 118 and a second region 112b surrounded by the bonding region 118. In addition, the protection layer 106 has a void 119 (as shown in FIG. 1) resulted from the penetration of the other end portion 116 of the bonding wire 108 through the protection layer 106. The bonding wire 108 is bonded to the bonding region 118 through the void 119, and the copper-copper bonding interface, the copper-palladium-copper (Cu—Pd—Cu) intermetallic region, or the copper and gold alloy layers formed at the location of the void 119. The molding compound 110 covers the semiconductor device 104, the contact pad 112, and the bonding wire 108.

Before a wire bonding process is performed, the protection layer 106 remains substantially intact on the contact pad 112. During wire bonding, the bonding wire 108 penetrates the protection layer 106 and bonds with the contact pad 112, but the remainder of the surface is still covered, and thereby protected, by the protection layer 106. Specifically, during the second end bonding process, the wire-bonding tool used, e.g., a "capillary", is moved to the location for the second end bonding and rests against the surface of the contact pad 112 with the protection layer 106 thereon. Then, ultrasonic energy transmitted by the capillary scrubs the protection layer 106 from the pad surface and creates a metallurgical bond between the second end portion 116 of the bonding wire 108 and the contact pad 112. In some embodiments, the capillary may not scrub the protection layer 106 completely off the pad surface such that a discontinuous residual layer may be formed in the bonding region. The residual layer mainly includes un-vaporized particles, e.g., silver particles (in the organic metal material), Si or Al (in the ceramic nano-coating material).

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a semiconductor device;
   a substrate including a contact pad having a protection layer disposed thereon, wherein the protection layer comprises a conductive organic material having metal particles;
   a bonding wire connecting the semiconductor device to the contact pad, wherein an end of the bonding wire penetrates the protection layer and bonds with a portion of a surface of the contact pad to form a bonding region; and
   a molding compound encapsulates the semiconductor device, the contact pad, and the bonding wire.

2. The semiconductor package of claim 1, wherein the contact pad is exposed from a solder mask and covered substantially entirely by the protection layer except at the bonding region.

3. The semiconductor package of claim 1, wherein a wirebond at the contact pad is copper-to-copper.

4. The semiconductor package of claim 1, wherein the conductive organic material comprises a combination of an electrically conductive polymer and a plurality of noble metal particles.

5. The semiconductor package of claim 1, wherein the bonding wire is a palladium coated copper wire.

6. The semiconductor package of claim 1, wherein the bonding region includes a copper-palladium-copper intermetallic.

7. The semiconductor package of claim 1, wherein the bonding wire is a gold wire.

8. A semiconductor package, comprising:
   a substrate comprising at least one contact pad, wherein the contact pad is made primarily of copper;
   a semiconductor device disposed on the substrate;
   a bonding wire connecting the semiconductor device to the contact pad, wherein the bonding wire is made primarily of copper;
   a copper-copper interface, formed between the contact pad and the bonding wire;
   a protection layer covering substantially entirely the surface of the contact pad except a bonding region between the contact pad and the bonding wire; wherein the protection layer comprises a conductive organic material having metal particles; and
   a package body encapsulating the semiconductor device, the contact pad, and the bonding wire.

9. The semiconductor package of claim 8, wherein the conductive organic material comprises a combination of an electrically conductive polymer and a plurality of noble metal particles.

10. A semiconductor package, comprising:
    a substrate comprising a contact pad, wherein the contact pad is made of copper;
    a palladium coated copper wire coupled to the contact pad and defining a bonding region on the contact pad;
    a protecting material surrounding the bonding region, the protecting material comprising a conductive organic material having metal particles; and
    a copper-palladium-copper intermetallic region located in the bonding region.

11. The semiconductor package of claim 10, wherein the conductive organic material comprises a combination of an electrically conductive polymer and a plurality of noble metal particles.

12. The semiconductor package of claim 10, wherein the protecting material passivates the contact pad to reduce oxidation.

* * * * *